(12) United States Patent
Ueki et al.

(10) Patent No.: US 7,496,123 B2
(45) Date of Patent: Feb. 24, 2009

(54) VCSEL WITH IMPROVED HIGH FREQUENCY CHARACTERISTICS, SEMICONDUCTOR LASER DEVICE, MODULE, AND OPTICAL TRANSMISSION DEVICE

(75) Inventors: Nobuaki Ueki, Kanagawa (JP); Naotaka Mukoyama, Kanagawa (JP); Ryoji Ishii, Kanagawa (JP); Takeshi Nakamura, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 11/706,597

(22) Filed: Feb. 15, 2007

(65) Prior Publication Data
US 2008/0043793 A1    Feb. 21, 2008

(30) Foreign Application Priority Data
Aug. 17, 2006  (JP) .............................. 2006-222179

(51) Int. Cl.
*H01S 3/00* (2006.01)
*H01S 5/00* (2006.01)
*H01S 3/097* (2006.01)

(52) U.S. Cl. .............................. 372/38.05; 372/50.124; 372/87

(58) Field of Classification Search ................ 372/50.1, 372/50.124, 81, 87, 38.05
See application file for complete search history.

(56) References Cited

U.S. PATENT DOCUMENTS

2006/0280218 A1*  12/2006  Kaneko et al. ................ 372/81

FOREIGN PATENT DOCUMENTS

| JP | 2002-368334 | 12/2002 |
|---|---|---|
| JP | 2004-47532 | 2/2004 |

* cited by examiner

*Primary Examiner*—Armando Rodriguez
(74) *Attorney, Agent, or Firm*—Fildes & Outland, P.C.

(57) ABSTRACT

A VCSEL including a substrate, a first semiconductor layer of a first conductivity-type formed on the substrate, an active layer formed on the first semiconductor layer, a second semiconductor layer of a second conductivity-type formed on the active layer, a first electrode wiring formed on a main surface of the substrate and electrically connected with the first semiconductor layer, a second electrode wiring formed on the main surface of the substrate and electrically connected with the second semiconductor layer, and a light emitting portion formed on the substrate for emitting laser light. A contact portion at which the first electrode wiring is electrically connected to the first semiconductor layer is formed in a range equal to or greater than $\pi/2$ radians and within $\pi$ radians, centering on the light emitting portion.

16 Claims, 8 Drawing Sheets

Relation between characteristic impedance and κ of coplanar lines

400 Optical transmission device

500 Spatial transmission system

600 Optical transmission system

VCSEL WITH IMPROVED HIGH FREQUENCY CHARACTERISTICS, SEMICONDUCTOR LASER DEVICE, MODULE, AND OPTICAL TRANSMISSION DEVICE

BACKGROUND

1. Technical Field

This invention generally relates to a surface-emitting semiconductor laser element used for a light source for optical data processing or high-speed optical communication, and a manufacturing method thereof.

2. Related Art

Recently, in technical fields such as optical communication or optical storage, there has been a growing interest in Vertical-Cavity Surface-Emitting Laser diode (hereinafter referred to VCSEL).

VCSELs have advantages in that they require lower threshold current and have smaller power consumption than edge-emitting semiconductor lasers, which have been used for laser light sources. Other excellent characteristics which edge-emitting semiconductor lasers do not have are: a round light spot can be easily obtained; evaluation can be performed while VCSELs are on a wafer; and light sources can be arranged in two-dimensional arrays. On the other hand, because the volume of the active region of a VCSEL is small, which leads to low threshold current; it is difficult to obtain high optical output that excess 10 mW with a VCSEL. Another disadvantage is that VCSEL's resistance, which is typically several tens to several hundreds ohms, is significantly higher than edge emitting semiconductor lasers (several ohms).

Optical communication using optical fibers has been used for data transmission mainly for data transmission at middle to long distance (several kilometers to several dozen kilometers) until now. Such transmission has been using single-mode optical fibers made of quartz, and laser that has a lasing peak in the long wavelength region of 1.31 micrometers or 1.55 micrometers. These are light sources that have advantages of their less dispersion in the fibers, or extremely small transmission loss. However, they also have many disadvantages in that thermal control of device maybe required, or the optical-axis alignment between optical fibers and laser may require some effort, for example. In addition, main users are communication carriers and thus products of these light sources for general consumers are manufactured in small quantities, which makes the system itself that uses these light sources expensive.

In these days, thanks to the proliferation of Asymmetric Digital Subscriber Line (ADSL) and Cable Television (CATV), ten to hundred times higher-speed and higher-capacity data transmission than ever before has been achieved, and Internet users have been increasing. With the increase, needs for a still higher-speed and higher-capacity data transmission have been arising even in ordinary households, and optical fibers have been provided to many households.

However, it is uneconomic to use the combination of single-mode optical fibers, which are mainly used for middle to long distance transmission, and Distributed Feedback (DFB) laser for transmitting data at such short distance as between a household and a utility pole, which is typically several to several dozen meters at the longest. For the transmission at such short distance (less than several hundreds meters), it is more cost effective to use a less expensive optical fiber, such as a multi-mode silica fiber or Plastic Optical Fiber (POF). Accordingly, the light source to be used for these multi-mode optical fibers should be inexpensive itself. In addition, it is desirable that it does not require a specific optical system or driving system. Thus, a VCSEL, which satisfies these requirements, is one of promising candidates.

In the technology of Local Area Network (LAN), an indoor network, data transmission rate has been increased from ten megabits per second to hundred megabits per second. Recently some LANs provide one gigabits per second, which is expected to be increased to ten gigabits per second in near future. Electrical wirings that use twisted pair cables, which are made of copper, can accommodate up to one gigabits per second. However, it is expected that, for a region beyond one gigabits per second, electrical wirings would face limits in terms of noise resistance and be replaced by optical wirings.

There have been increasing cases to adopt VCSELs for light sources of optical wirings that are used for Ethernet (registered Trademark), which delivers ten gigabits per second, and such VCSELs have been developed. For the modulation bandwidth of as much as several gigahertz, there is no problem at present. However, to further increase the modulation bandwidth, some measure should be taken.

A 3 dB down cut-off frequency ($f_{3\,dB}$), an indicator that shows modulation bandwidth of a semiconductor laser element, can be expressed by the following formula (1) when the inductive reactance is as small as negligible;

$$f_{3dB} = \frac{1}{2\pi CR} \quad (1)$$

where C is the capacitance of the element, and R is the resistance of the element. As can be seen from the formula, modulation bandwidth depends on the CR time constant of the element, and reduction thereof can lead to expansion of bandwidth.

The resistance of the element can be reduced if the diameter of the light emitting region is increased. However, the increase of the diameter of light emitting region inevitably increases the volume of the active region, which impairs response. Therefore, it is found that an easiest way to improve response is to reduce the capacitance of the element.

For the purpose of reducing of the capacitance of the element of a VCSEL, various configurations have been proposed. Typical examples include a polyimide buried structure, or a coplanar electrode structure.

The capacitance C caused between parallel plate conductors can be obtained by the following formula (2);

$$C = \frac{\varepsilon_0 \varepsilon_s S}{d} \quad (2)$$

where $\varepsilon_0$ is vacuum permittivity (8.854×10$^{-12}$ F/m), $\varepsilon_s$ is relative permittivity inherent in the material, S is the area of the conductor, and d is the distance between the conductors.

FIG. 16 is a plan view illustrating a configuration of a VCSEL of a related art having a coplanar electrode structure. The VCSEL includes a light emitting portion 1 having a cylindrical mesa (or post) structure that emits laser light on a substrate, and an annular p-side electrode 2 disposed on a top portion of the mesa. The p-side electrode 2 is connected to a p-side contact layer on a top portion of the mesa through an annular contact region 3 (shown by a hatch pattern). To form a coplanar electrode structure, n-side electrodes 4a and 4b on the ground side are electrically connected to an n-type semiconductor layer 5 (shown by a hatch pattern) below an active layer through a contact hole that extends so as to surround most portion of the light emitting portion 1. To increase contact area between the n-side electrodes 4a and 4b and the n-type semiconductor layer 5, especially in FIG. 16, the contact portion or contact hole of the n-side electrodes 4a and 4b and the n-type semiconductor layer 5 extends over the line L of θ=π (radian) that passes across center of the light emitting portion 1, having a larger angle than the line L. However, it is found that, with such configuration of the contact portion, carriers diffused from the p-side electrode 2 (arrows indicate direction of current flow) lose their way to go in a region 6 below the line L, which causes so-called current crowding. This increases recombination, which does not contribute to light emission, and makes threshold current higher than expected.

In addition, although two electrodes 4a and 4b on the ground side are formed to form the coplanar electrode structure, it is expected that inadequate routing of these electrodes may cause interference between magnetic field lines, resulting in transmission loss.

As such, regarding electrode structures of VCSELs of related arts for the aim of improving high frequency characteristics, there is still room for improvement.

SUMMARY

An aspect of the present invention provides a VCSEL that includes a substrate, a first semiconductor layer of a first conductivity-type formed on the substrate, an active layer formed on the first semiconductor layer, a second semiconductor layer of a second conductivity-type formed on the active layer, a first electrode wiring formed on a main surface of the substrate, a second electrode wiring formed on the main surface of the substrate, and a light emitting portion formed on the substrate. The first electrode wiring is electrically connected with the first semiconductor layer. The second electrode wiring is electrically connected with the second semiconductor layer. The light emitting portion emits laser light. A contact portion at which the first electrode wiring is electrically connected to the first semiconductor layer is formed in a range equal to or greater than π/2 radians and within π radians, centering on the light emitting portion.

BRIEF DESCRIPTION OF THE DRAWINGS

Embodiment(s) of the present invention will be described in detail based on the following figures, wherein.

DETAILED DESCRIPTION

Exemplary embodiments of the present invention will be given, with reference to the accompanying drawings. A VCSEL according to an exemplary embodiment preferably includes a pillar-shaped structure (often called a post structure or a mesa shape) formed on a semiconductor substrate, and emits laser light from a top portion or a bottom portion of the post.

Figure 1:
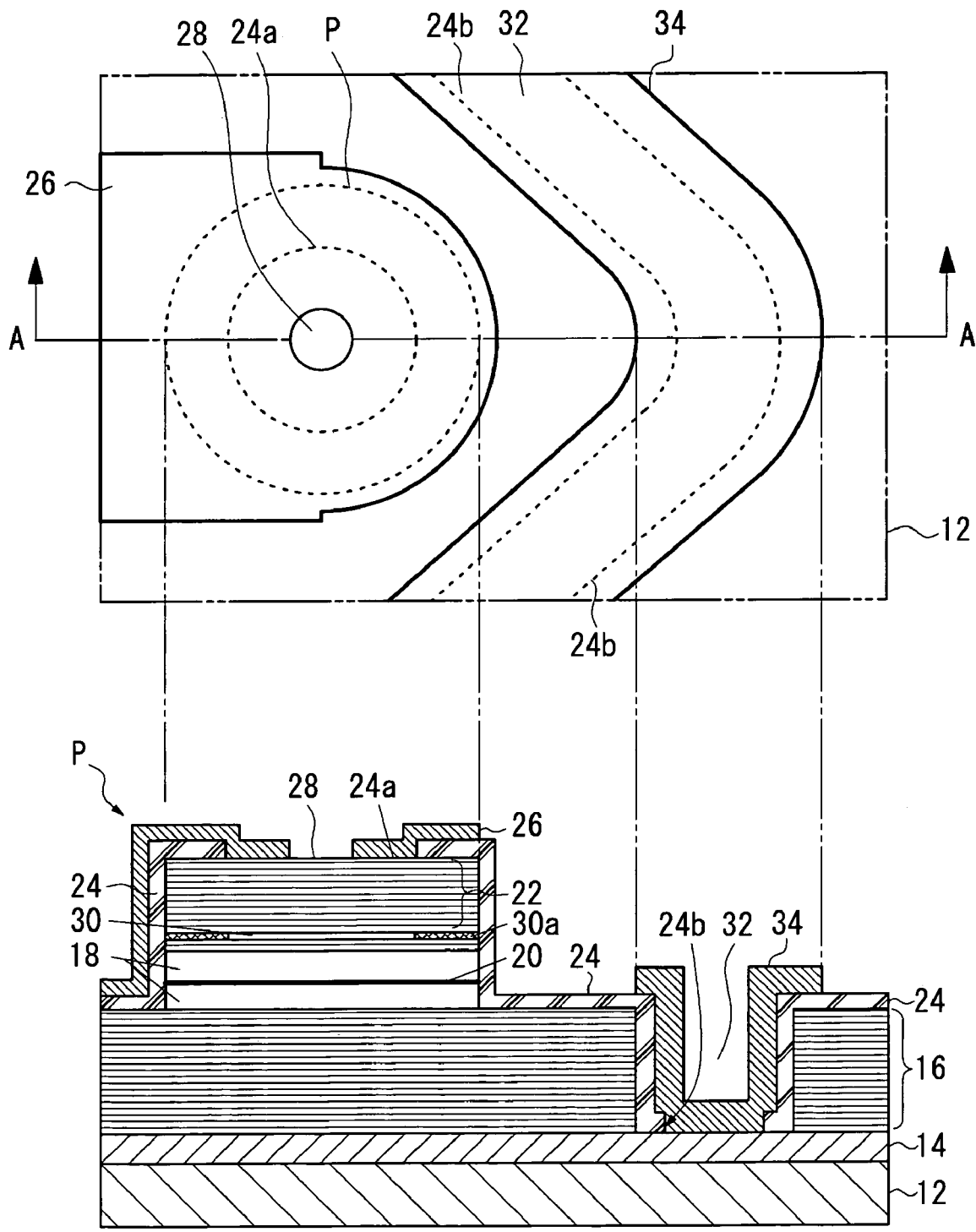
FIG. 1 illustrates a plan view of a VCSEL according to an example of the present invention and a schematic cross sectional view taken along line A-A thereof.

FIG. 1 is a plan view illustrating a configuration of a VCSEL according to an example of the present invention, and a cross section thereof taken along line A-A. As shown in FIG. 1, a VCSEL 10 is formed on a semi-insulating semiconductor substrate 12, by sequentially stacking an n-type buffer layer 14, an n-type lower multilayer reflective film 16, an active layer 20 sandwiched by spacer layers 18, and a p-type upper multilayer reflective film 22.

The lower multilayer reflective film 16 and the upper multilayer reflective film 22 form a Distributed Bragg Reflector (DBR). On the substrate 12, a cylindrical post P is formed by etching from the upper multilayer reflective film 22 to reach the lower multilayer reflective film 16.

The side wall and outer peripheral portion of the post P is covered and protected with an interlayer insulating film 24. On a top portion of the post P, a round-shaped contact hole 24a that passes through the interlayer insulating film 24 is formed, and a p-side contact electrode 26 is formed and positioned in the contact hole 24a, The p-side contact electrode 26 is electrically connected to the upper multilayer reflective film 22, and injects current, which is required for lasing, from the upper multilayer reflective film 22 to the active layer 20. In a portion of the upper multilayer reflective film 22 in the post P, a current-confined layer 30 is formed. In the current-confined layer 30, an oxidized region 30a that is oxidized from the side surface of the post P is formed. The oxidized region 30a surrounds a round-shaped conductive region to confine current and light. In a center portion of the p-side contact electrode 26, a round-shaped opening portion 28 is formed. The opening portion 28 defines an emitting region of laser light that is emitted from the active layer 20 together with the oxidized region 30a included in the post P.

In the lower multilayer reflective film 16 that forms the bottom portion of the post P, an opening 32 (via hole) that reaches to the buffer layer 14 is formed by etching. The opening 32 is formed in a certain range surrounding the post P. The lower multilayer reflective film 16 that includes the opening 32 is covered with the interlayer insulating film 24, but at a bottom portion of the opening 32, a contact hole 24b is formed in the interlayer insulating film 24. An n-side electrode 34 is routed to surround the post P corresponding to the shape of the opening 32. The n-side contact electrode 34 is electrically connected to the buffer layer 14 through the contact hole 24b. As such, a coplanar electrode structure in which the p-side contact electrode 26 and the n-side contact electrode 34 are formed on a main surface of the substrate can be obtained.

Figure 2A:
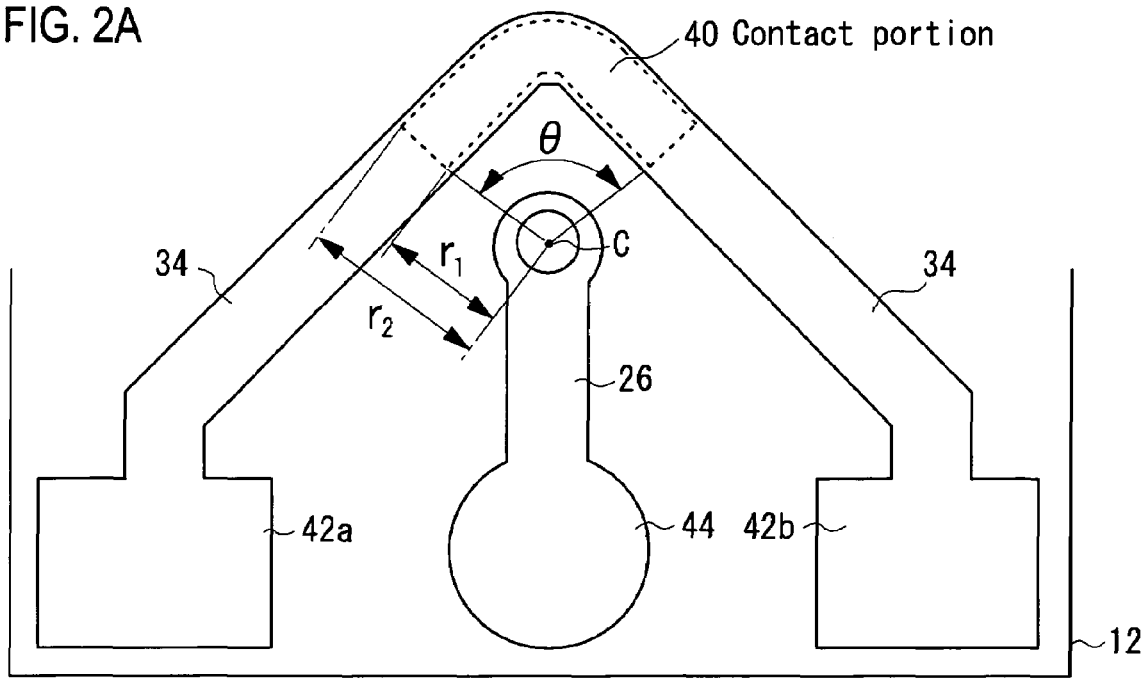
FIG. 2A is a schematic plan view for explaining the concept of a VCSEL according to an example of the present invention.

Referring now to FIGS. 2A and 2D, which are schematic plan views, an exemplary coplanar electrode structure will be described. As described above, in the vicinity of the post P (upper part of FIGS. 2A and 2B), the opening 32 whose deepest portion reaches the n-type buffer layer 14 is formed. The opening 32 forms a contact portion 40 (the region surrounded by a dashed line) of the n-side contact electrode 34. Each terminal of the n-side contact electrode 34 is connected to rectangular electrode pads 42a and 42b, and the p-side contact electrode 26 is connected to a round-shaped electrode pad 44.

The coplanar electrode structure according to this example is characterized in that the center C of the opening portion 28 at the top portion of the post P, in other words, the contact portion 40 (or the opening 32) when the optical axis of the light emitting portion of the post P is centered, is formed in a range where the interior angle $\theta$ of the center C is $\pi/2 \leq \theta < \pi$ (radian).

The shape of the contact portion 40 may be an arc line shape, arch-shape or an L-shape. Preferably, the contact portion 40 is an L-shape, and whose corner is $\pi/2$ radians. The n-side contact electrode 34 is patterned in the L-shape to cover the contact portion 40 and conform to the shape of the contact portion 40.

More specifically, as shown in FIG. 2A, the contact portion 40 is formed in a region that is sandwiched by substantial arc lines of a near radius r1 spaced a certain distance apart from the light emitting center C of the post, and a far radius r2 spaced a larger than the distance apart. The angle $\theta$ formed by both arc lines is equal to or greater than $\pi/2$ radians, and less than $\pi$ radians. Depending on the angle $\theta$ formed by the arc lines that defines the contact portion 40, the closest portion to the post P varies. When the angle $\theta$ is equal to or greater than $\pi/2$ radians, the light emitting portion approaches closest to the contact portion at a position of $\theta=\pi/2$. It should be noted that in a case where the angle $\theta$ is less than $\pi/2$, the light emitting portion approaches closest to the position at the maximum angle. In contrast, in a case where the angle $\theta$ is equal to or greater than $\pi/2$, the light emitting portion approaches closest to the contact portion 40 at a position of $\theta=\pi/2$.

Figure 2B:
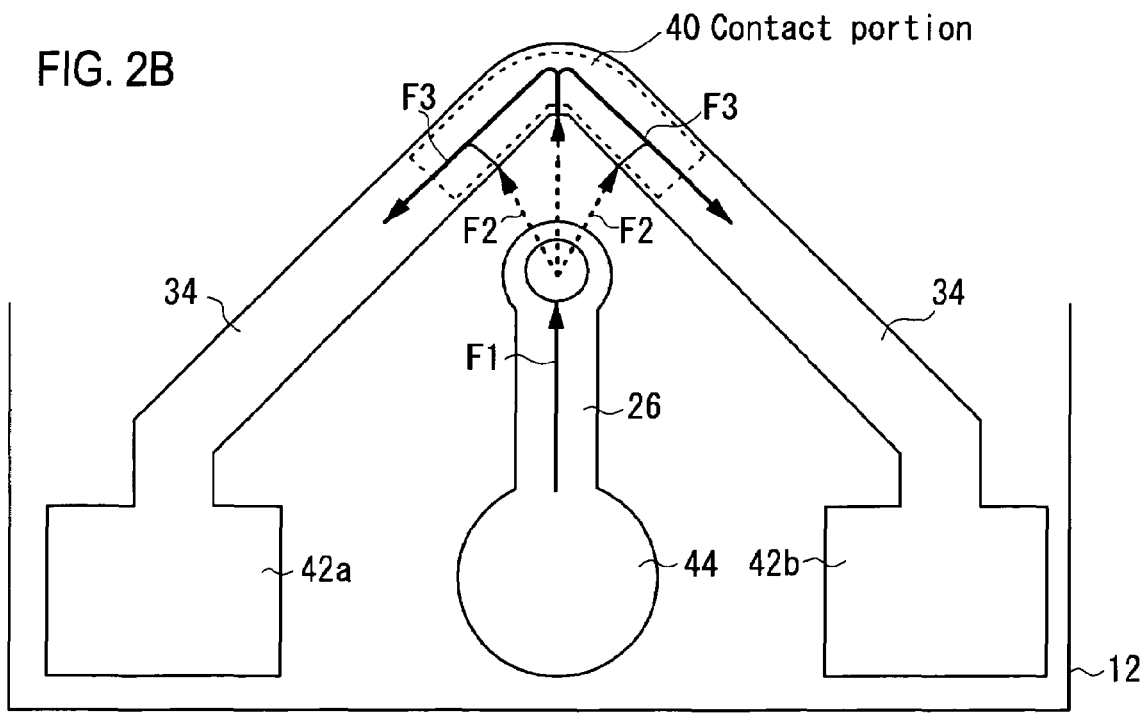
FIG. 2B shows current flow.

The flow of current injected from the p-side contact electrode is schematically shown in FIG. 2B. The current injected from the p-side contact electrode 26 flows in a direction F1. Injected carriers diffuse in directions F2 through the current-confined layer 30 made of the oxidized region 30a, and reach the n-side contact electrode 34. At that time, the carriers diffuse instantaneously toward the contact portion 40. For the carriers, it is most effective to reach the contact portion 40 at the shortest distance. In other words, the reason why $\theta$ is set to an angle in a range equal to or greater than $\pi/2$ radians and less than $\pi$ radians is because to make the distance, at which the carriers injected through the electrode diffuse, as shortest as possible. This allows a smooth flow of carriers, and prevents occurrence of ineffective current that does not contribute to lasing.

Figure 3:
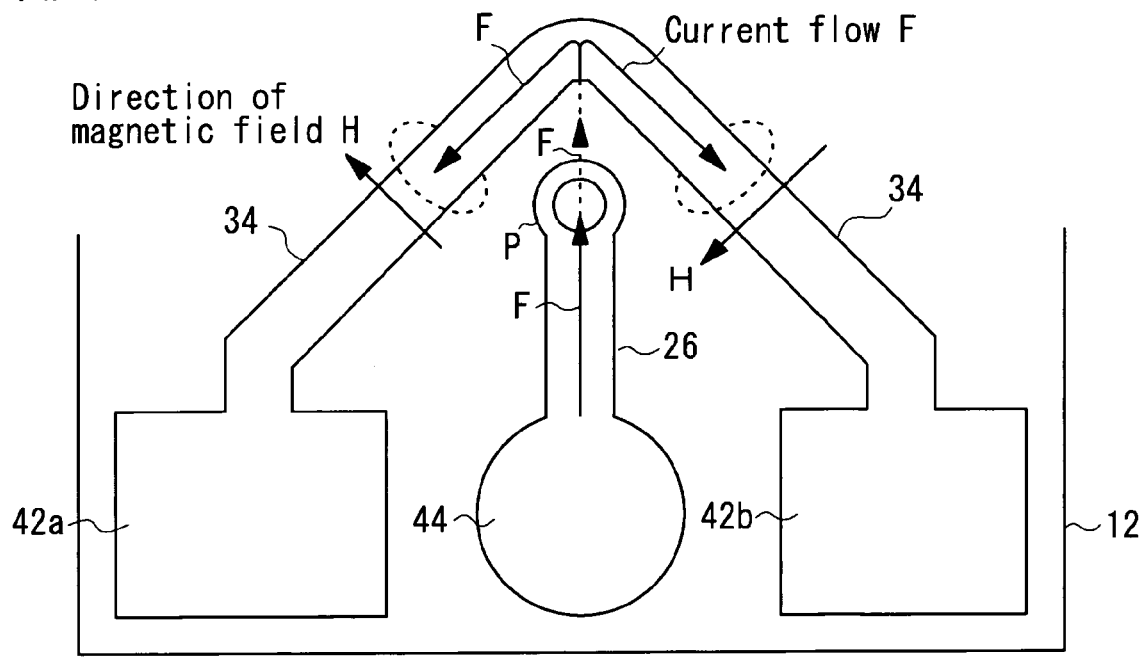
FIG. 3 is a schematic plan view illustrating an exemplary configuration of a coplanar electrode structure of a VCSEL according to an example of the present invention.

On the other hand, the carriers injected from the p-side contact electrode 26 pass through the device to the n-side contact electrode 34 that is electrically connected in the opening 32, and travel between both of the p-side and n-side electrode pads 42a, 42b and 44. FIG. 3 illustrates current flows F and directions of magnetic field H. As shown in FIG. 3, the flow of carriers (current) F produces magnetic field H based on Ampere's law (right-handed screw rule).

The shape of the n-side contact electrode 34 is a nearly L-shape, like a boomerang, and the angle formed by its two sides is $\pi/2$ radians. By making an orthogonal angle, two magnetic fields H produced along the two wiring directions of the n-side contact electrode 34 intersect on the surface of the device. This does not cause mutual interference, and keeps stable electromagnetic field distribution that does not vary with time. As a result, reduction of return loss of incoming signal, and improvement in modulation bandwidth can be expected.

Figure 4:
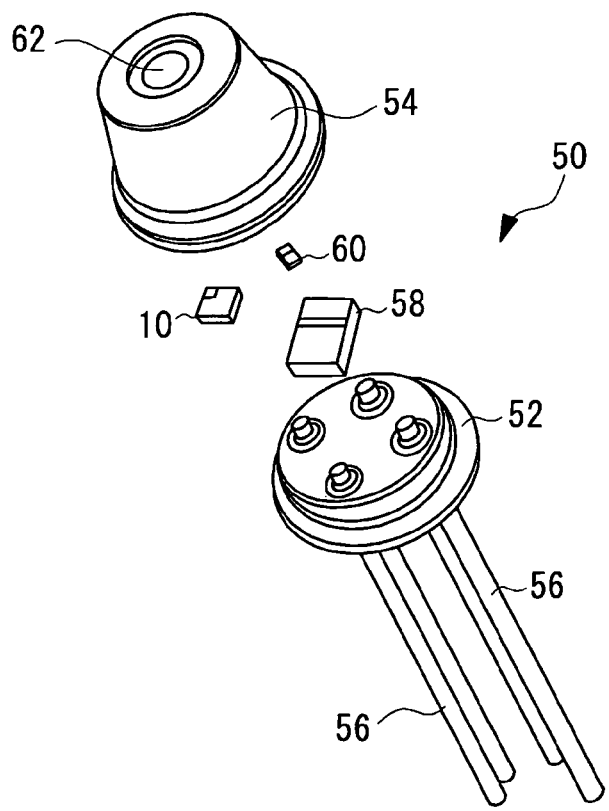
FIG. 4 is an exploded perspective view of a semiconductor laser device in which a VCSEL is implemented.

FIG. 4 is an exploded perspective view illustrating a schematic configuration of a semiconductor laser device in which a VCSEL shown in FIG. 1 is implemented. A semiconductor laser device 50 includes a metallic base (stem) 52, and a cap 54 to be mounted on the base 52. On back side of the base 52, plural lead terminals 56 are attached, and on the front side of the base 52, a rectangular submount 58 is mounted. The submount 58 is formed by metalizing with a metal layer, which becomes a microstrip line, on a surface of an insulating ceramic member, for example. On the submount 58, the VCSEL 10 shown in FIG. 1 and a light-sensing element 60 for monitoring are mounted. In a center portion of the cap 54, a window 62 is formed through which laser light emitted from the VCSEL 10 passes.

Figure 5:
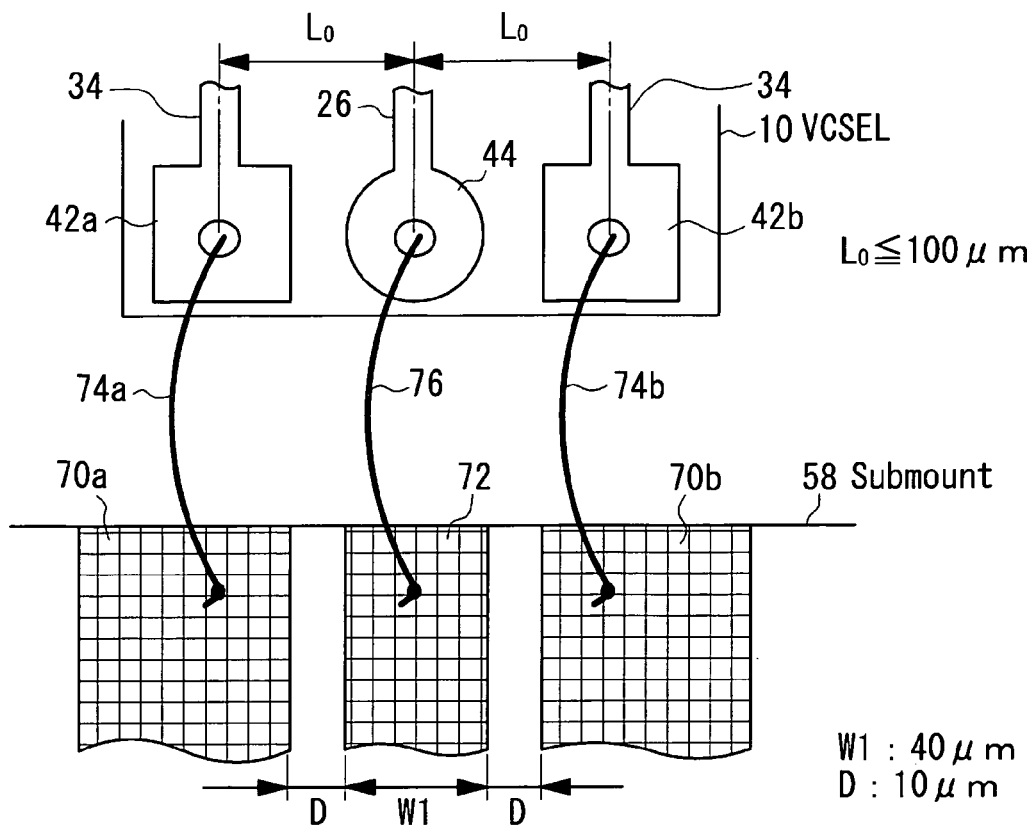
FIG. 5 is a plan view showing positional relationship between a coplanar electrode of a VCSEL and a submount according to an example of the present invention.

FIG. 5 is a plan view showing positional relationship between a coplanar electrode and a submount. In FIG. 5, the distances $L_0$ between centers of the electrode pad 44 connected to the p-side contact electrode 26 and the electrode pads 42a and 42b connected to the n-side contact electrodes 34 are 100 micrometers. The width of each of the electrode pads 42a and 42b is 60 micrometers. These values are determined depending on the permittivity of the substrate material (in this case, gallium arsenide), characteristic impedance of the coplanar electrode line that depends of the thickness of a wiring metal, for example.

On the submount 58, microstrip lines 70a and 70b for grounding are formed, and a microstrip line 72 for signal input is formed therebetween. The electrode pads 42a and 42b on the side of the VCSEL chip 10 are connected to the microstrip lines 70a and 70b with bonding wires 74a and 74b. The electrode pad 44 is connected to the microstrip line 72 with a bonding wile 76. The microstrip lines 70a, 70b and 72 are further electrically connected to leads 56 on the side of the base with bonding wires (not shown).

Figure 6:
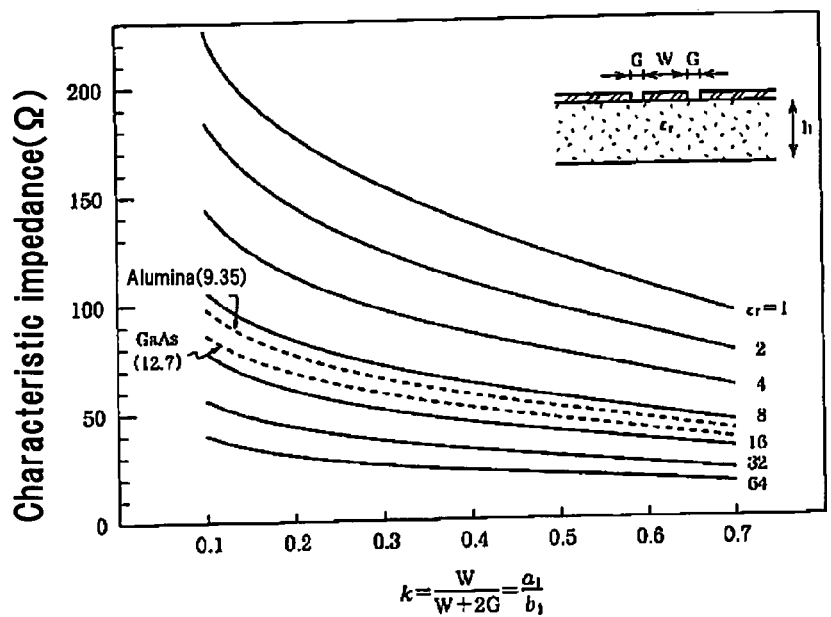
FIG. 6 is a graph showing the relationship between characteristic impedance and κ of coplanar lines.

The characteristic impedance of the microstrip lines 70a, 70b and 72 is approximately matched with the load impedance of the VCSEL that is operated at a frequency equal to or greater than about 5 GHz. FIG. 6 is a graph showing the relationship between the characteristic impedance and $\kappa$ of coplanar lines ("Ultra-high frequency electronics" written by Kazuhiko Honjo, The Nikkan Kogyo Shimbun, Ltd., 1999). $\kappa$ can be stated as $\kappa=W/(W+2G)$, where W is the width of the line for signal input, and G is the distance from the line to the lines for grounding on both sides thereof.

For example, when the characteristic impedance is matched to about 50 ohms, from the graph of FIG. 6, $\kappa$ is equal to or greater than about 0.5 (curved line for GaAs). Therefore, the distance D between the microstrip lines 70a and 70b of the submount 58 and the microstrip line 72 is set to 10 micrometers, and the width W1 of the microstrip line 72 is set to 40 micrometers.

Another advantage of setting the distances $L_0$ between centers of the electrode pads 42a and 42b and the electrode pad 44 to 100 micrometers, and setting the distance D and the width W1 of the microstrip lines to the values described above is that the length of the bonding wires 74a, 74b and 76, which are the wirings with the submount 58 that is interposed between the VCSEL 10 and the metallic base 52, can be shortened. This is effective in improving high frequency characteristics of the device.

The distances $L_0$ between centers of electrode pad are not necessarily limited to 100 micrometers as described above, and the distances $L_0$ between centers can be further shortened. However, if electrode pads overlap on the surface of the device, they do not act as independent electrodes. Therefore, in a case where the distance $L_0$ between centers is equal to or less than 100 micrometers, the width of the electrode pads should be chosen adequately depending on the center distance.

Also in the coplanar electrode structure according to this example, the n-side contact electrode 34 is made into electrically contact with the buffer layer 14 exposed on the bottom portion of the opening 32, and the metallic film is made of four layers in the order from the bottom layer; titanium, gold, gold-germanium alloy, gold. The buffer layer 14, made of gallium arsenide, is an exposed layer by etching, and thus impurities tend to adhere to the layer and it is difficult to obtain ohmic characteristic as compared with the top portion of the post. Therefore, after providing a lower layer electrode made of titanium and gold in the opening 32, and an upper layer electrode made of germanium alloy and gold is provided thereon to improve ohmic characteristic.

The upper layer electrode is long, having a nearly L-shape, and thus heat is dissipated through the electrode. Therefore, it is expected that this would produce the effect of increasing heat conductivity of the device, and preventing generation of local Joule heat.

Next, a VCSEL according to an example will be described in further detail. In the description below, notation of the materials uses chemical symbols (symbol of element, or chemical formula).

Figure 7A:
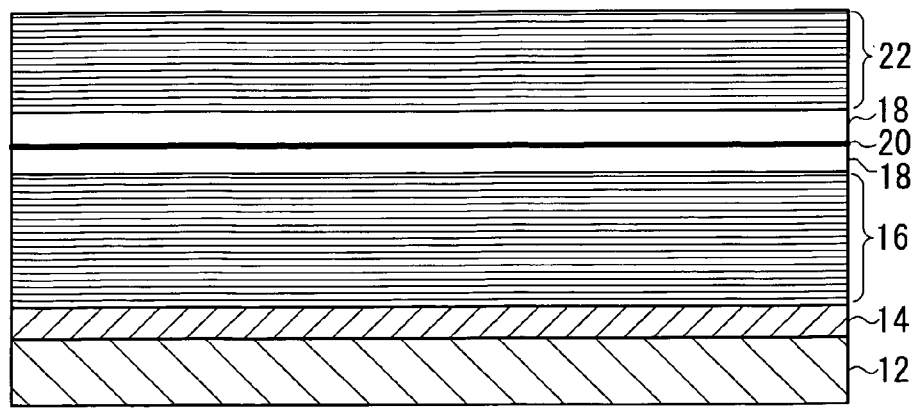
FIGS. 7A to 7C show schematic cross sections for explaining manufacturing steps of a VCSEL according to an example of the present invention.

As shown in FIG. 7A, a VCSEL according to an example is formed on a semi-insulating GaAs substrate 12, by Metal Organic Chemical Vapor Deposition (MOCVD) to sequentially stack following layers; a buffer layer 14 made of n-type GaAs layer, a lower multilayer reflective film 16 made of plural layers of staking layer of n-type $Al_{0.8}Ga_{0.2}As$ layers and n-type $Al_{0.1}Ga_{0.9}As$ layers, a spacer layer 18 made of n-type $Al_{0.4}Ga_{0.6}As$ layer, an active layer 20 made of stacking layers of a barrier layer made of undoped $Al_{0.2}Ga_{0.8}As$ layer and a quantum well layer made of undoped GaAs layer, and an upper multilayer reflective film 22 made of plural layers of stacking layer of p-type $Al_{0.8}Ga_{0.2}As$ layers and p-type $Al_{0.1}Ga_{0.9}As$ layers.

The buffer layer 14 is a single layer made of GaAs having a thickness of 2 micrometers, and the carrier concentration after silicon is doped as an n-type impurity is $1\times10^{19}$ $cm^{-3}$.

The thickness of each of the layers that form the lower multilayer reflective film 16 is $\lambda/4n_r$ (where $\lambda$ is lasing wavelength, $n_r$ is optical refractive index of the medium). The film 16 is made by alternately stacking 34.5 periods of two layers having different aluminum composition ratio. The carrier concentration after silicon is doped as an n-type impurity is $5\times10^{18}$ $cm^{-3}$.

The active layer 20 is formed by alternately stacking a quantum well active layer having a thickness of 8 nm made of undoped GaAs layer and a barrier layer having a thickness of 5 nm made of undoped $Al_{0.2}Ga_{0.8}As$ layer (wherein outer layer is the barrier layer). The active layer 20 is disposed in a center portion of the spacer layer 18 made of undoped $Al_{0.4}Ga_{0.6}As$ layer. It is designed such that the film thickness of the spacer layer 18 that contains the quantum well active layer 20 and the barrier layer becomes an integral multiple of $\lambda/n_r$. From the active layer 20 with such configuration, radiation light with a wavelength of 850 nm can be obtained.

The thickness of each of the layers that form the upper multilayer reflective film 22 is $\lambda/4n_r$ as in the case of the lower multilayer reflective film 16. The upper multilayer reflective film 22 is made by alternately stacking 22 periods of two layers having different aluminum composition ratio. The carrier concentration after carbon is doped as a p-type impurity is $5\times10^{18}$ $cm^{-3}$.

Although not especially shown, the bottommost layer of the upper multilayer reflective film 22 is AlAs having a height of 30 nm and a higher aluminum composition ratio than other layers, instead of $Al_{0.8}Ga_{0.2}As$. This is because an oxidized region is formed later in a portion of this layer to make it a current-confined portion, and light is confined at the same time to define a light-emitting region.

The reason because the number of period (the number of layers) of the upper multilayer reflective film 22 is less than that of the lower multilayer reflective film 16 is to cause a difference in reflectively between upper and lower portions, and to produce laser light from upper surface of the substrate. In addition, although not described in detail, for the purpose of lowering series resistance of the device, between the layer of $Al_{0.8}0Ga_{0.2}As$ and the layer of $Al_{0.1}Ga_{0.9}As$, an intermediate layer having an intermediate aluminum composition ratio of these two AlGaAs layers is provided.

Although not especially shown, the uppermost layer of the upper multilayer reflective film 22 is a p-type GaAs layer having a thickness of 20 nm, instead of $Al_{0.1}Ga_{0.9}As$, to obtain ohmic contact with the p-side contact electrode 26 described later. The carrier concentration after zinc is doped as a p-type impurity is $1\times10^{19}$ $cm^{-3}$.

Figure 7B:
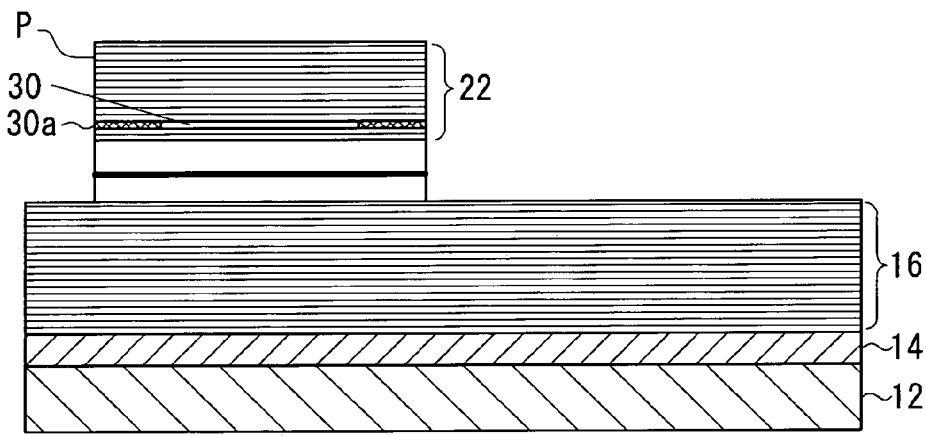

Next, as shown in FIG. 7B, a cylindrical structure having a diameter of 50 μm is formed on an epitaxial substrate by Reactive Ion Etching (RIE).

The substrate on which the post P is formed is thermally processed in a vapor atmosphere at a high temperature to form an oxidized region 30a. An AlAs layer 30 inserted in the bottommost layer of the upper multilayer reflective film 22 has a significantly faster oxidation speed than other layers, and thus oxidation proceeds from outer peripheral portion of the post and its chemical composition changes into alumina ($Al_2O_3$). $Al_2O_3$ has a high insulating characteristic, and a lower refractive index than its peripheral region, and thus a current-confined and light-confined layer is formed.

Figure 7C:
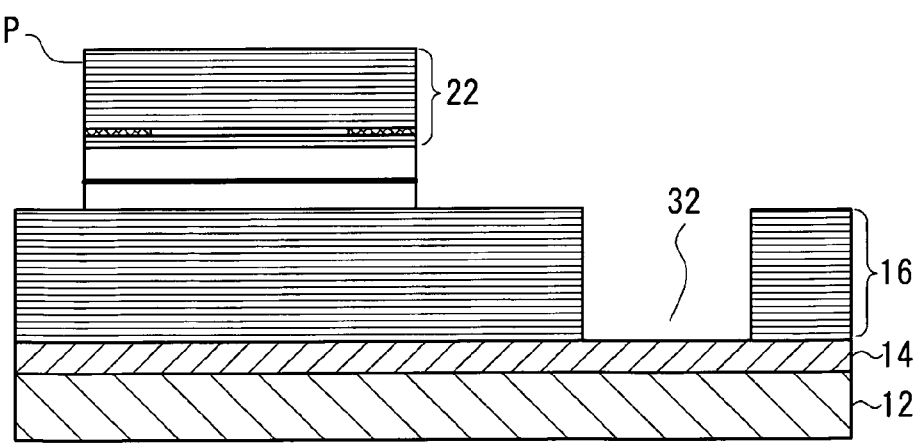

Then, by further RIE, as shown in FIG. 7C, an opening 32 is formed near the post P. The opening 32 is formed in a region sandwiched by arc lines of a near radius r1 and a far radius r2 from the light emitting center of the post P.

Figure 8:
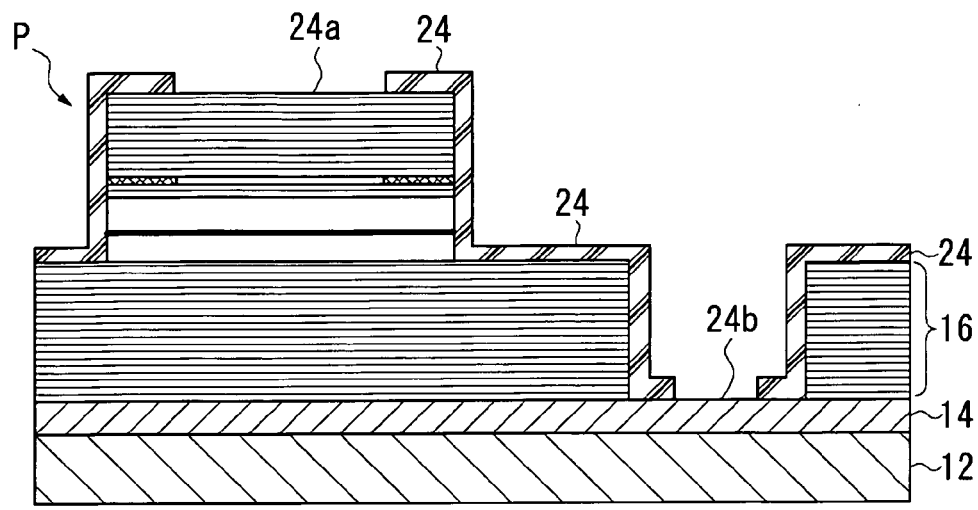
FIG. 8 is a schematic cross section for explaining a manufacturing step of a VCSEL according to an example of the present invention.

Next, as shown in FIG. 8, on the upper surface of the substrate that includes exposed post side surface and the side surface of the via hole, silicon nitride ($SiN_x$) having a film thickness of 0.5 μm is deposited. Then contact holes 24a and 24b are formed at a top portion of the post and at a bottom portion of the opening 32, respectively. Remained $SiN_x$ acts as interlayer films (insulating films) 24.

Then, to obtain electrical contact with the p-type GaAs layer formed in the uppermost layer of the upper multilayer reflective film 22, and with the n-type buffer layer 14, at each of the top portion of the post and at the bottom portion of the opening 32, a lower layer metal film made of titanium-gold two-layer structure (Ti/Au) is formed. In the lower layer metal film at the top portion of the post P, an opening portion 28 having a diameter of 20 μm is formed in a center portion for light emission. Although not shown, an extraction wiring and an electrode pad are formed for implementation, and the lower layer metal film acts as a p-side contact electrode 26.

In the opening 32, adding to the lower layer metal film made of Ti/Au, an upper layer metal film made of a two-layer structure of gold-germanium and gold (Au—Ge/Au) is added, which is patterned into an L-shape. Although not shown, an extraction wiring and an electrode pad for implementation are patterned simultaneously, and the layer acts as an n-side contact electrode 34.

As described above, according to an example, a VCSEL with improved high frequency characteristics can be obtained. Another advantage is that in effective current is reduced. This improves response characteristic of the device as well as reliability. Moreover, the electrical wiring having long length improves heat dissipation, and thus a VCSEL device with high light emitting efficiency and better response characteristic can be obtained with high reproducibility and stability.

In the examples described above, the post P has a cylindrical shape; however, it may be a rectangular prism shape, for example, and the shape can be selected as desired in a range within the operational principle of the present invention. Also, in each of the examples, sandwiching the active layer, the conductivity type of the far side from the substrate is p-type and near side is n-type; however, it is not necessarily limited to these examples, and the conductivity type may be vice versa.

In the VCSEL according to the examples, compound semiconductor laser of gallium arsenide system is shown; however, it is not necessarily limited to this material. It may be a semiconductor laser using a material of gallium nitride system or gallium indium arsenide system, and lasing wavelength may be altered as appropriate, accordingly.

Also, according to the examples, for the oxidized region 30a, which becomes a current-confined and light-confined portion through the oxidation step, the AlAs layer which does not contain gallium is used. However, it is not necessarily limited to this material, and an $Al_{0.98}Ga_{0.02}As$ layer, or a material that is lattice matched to the semiconductor substrate and has a sufficiently higher oxidation speed than surrounding semiconductor layers may be used. In addition, according to the examples, the position at which the oxidized region 30a is inserted is above the spacer layer 18; however, it may be inserted below, or both above and below the spacer layer 18.

Figure 9:
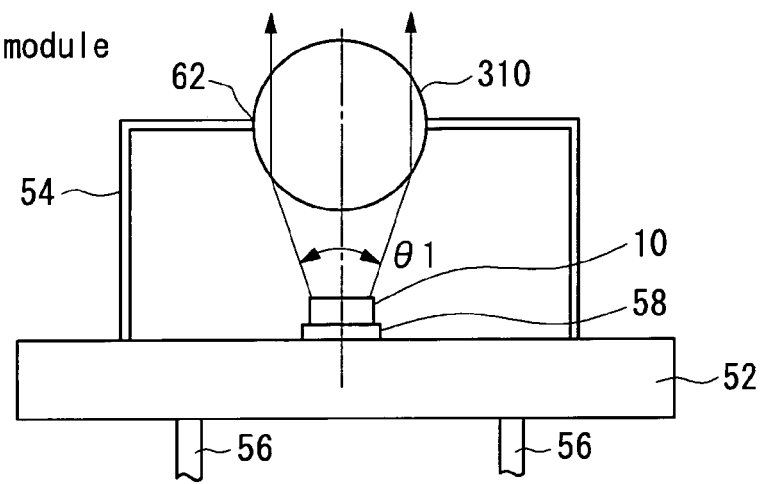
FIG. 9 is a schematic cross section illustrating a configuration of a module in which an optical component is implemented in the semiconductor laser device shown in FIG. 4.

FIG. 9 is a schematic cross section illustrating an example of a module on which an optical component is mounted on the semiconductor laser device shown in FIG. 4. The same references have been retained for similar configurations to those of FIG. 4. In a module 300, a ball lens 310 is fixed in the emitting window 62 of the cap 54. The optical axis of the ball lens 310 is positioned to match an approximate center of the opening portion 28 at a top portion of the post. The distance between the VCSEL 10 and the ball lens 310 may be adjusted so that the ball lens 310 is contained within the radiation angle θ1 of the laser light from the VCSEL 10.

Figure 10:
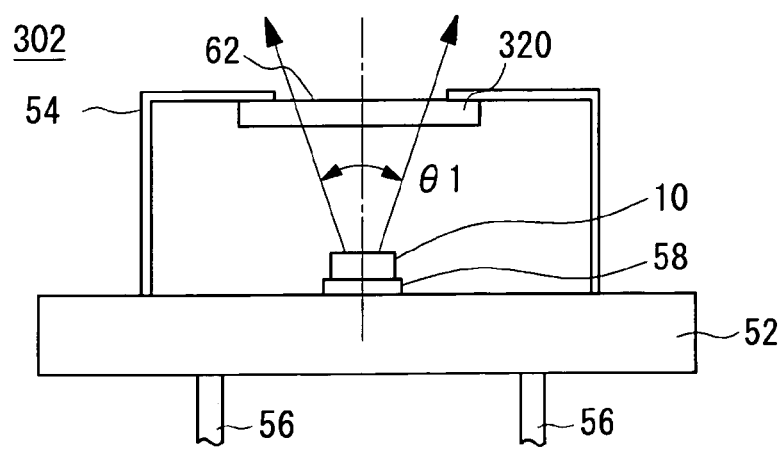
FIG. 10 is a schematic cross section illustrating a configuration of another module.

FIG. 10 illustrates a configuration of another module, which is preferably used for a spatial transmission system described later. In a package 302 shown in FIG. 10, instead of using the ball lens 310, a flat window cap (glass) 320 is fixed in the emitting window 62 in the center of the cap 54. The center of the flat window cap (glass) 320 is positioned to match the optical axis of the VCSEL 10. The distance between the VCSEL 10 and the flat window cap (glass) 320 may be adjusted so that the opening diameter of the flat window cap (glass) 320 is equal to or greater than the radiation angle θ1 of the laser light from the VCSEL 10.

Figure 11:
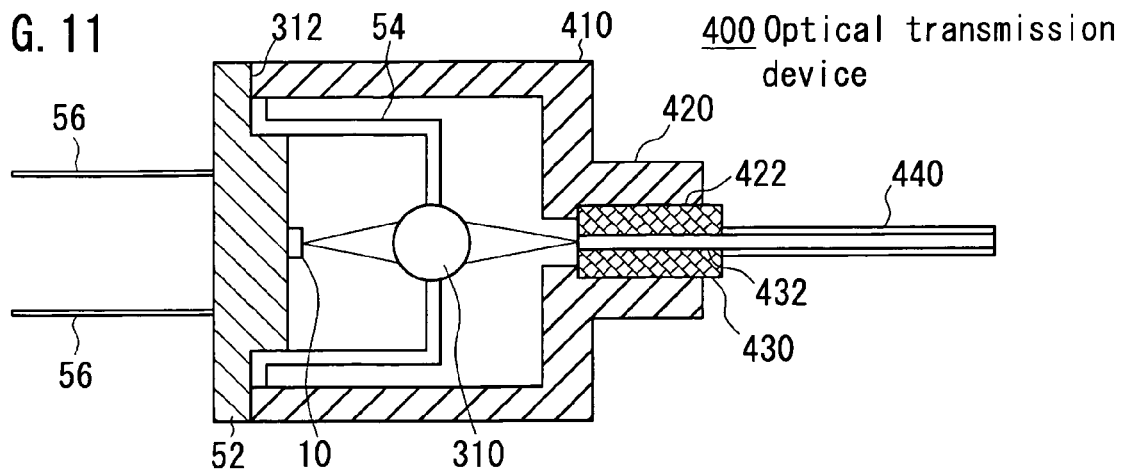
FIG. 11 is a schematic cross section illustrating a configuration of an optical transmission device in which the module shown in FIG. 9 is used.

FIG. 11 is a cross sectional view illustrating a configuration in which the module or package shown in FIG. 9 is applied to an optical transmission device. An optical transmission device 400 includes a cylindrical housing 410 fixed to a stem 52, a sleeve 420 formed integral with the housing 410 on the edge surface thereof, a ferrule 430 held in an opening 422 of the sleeve 420, and an optical fiber 440 held by the ferrule 430.

In a flange 312 formed in a direction of the circumference of the stem 52, an edge portion of the housing 410 is fixed. The ferrule 430 is positioned exactly in the opening 422 of the sleeve 420, and the optical axis of the optical fiber 440 is aligned with the optical axis of the ball lens 310. In a through hole 432 of the ferrule 430, the core of the optical fiber 440 is held.

Laser light emitted from the surface of the VCSEL 10 is concentrated by the ball lens 310. The concentrated light is injected into the core of the optical fiber 440, and transmitted. While the ball lens 310 is used in the above example, other lens such as a biconvex lens or a plano-convex lens may be used. In addition, the optical transmission device 400 may include a driving circuit for applying an electrical signal to the leads 56. Furthermore, the optical transmission device 400 may have a receiving function to receive an optical signal via the optical fiber 440.

Figure 12:
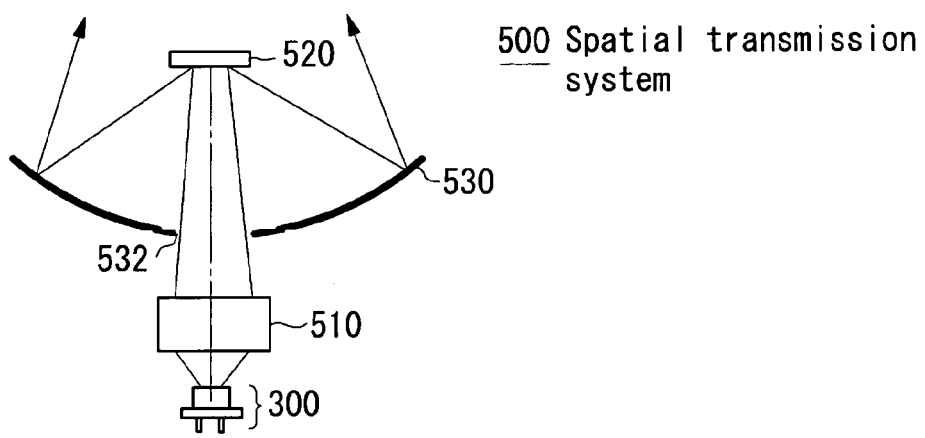
FIG. 12 illustrates a configuration of a spatial transmission system in which the module shown in FIG. 9 is used.

FIG. 12 illustrates a configuration in which the package shown in FIG. 9 is used in a spatial transmission system. A spatial transmission system 500 includes a module 300, a condensing lens 510, a diffusing plate 520, and a reflective mirror 530. In the spatial transmission system 500, instead of using the ball lens 310 that is used for the module 300, the condensing lens 510 is used. The light concentrated by the condensing lens 510 is reflected by the diffusing plate 520 through an opening 532 of the reflective mirror 530. The reflected light is reflected toward the reflective mirror 530. The reflective mirror 530 reflects the reflected light toward a predetermined direction to perform optical transmission. For a light source for spatial transmission, a multi-spot type VCSEL may be used to obtain a higher output.

Figure 13:
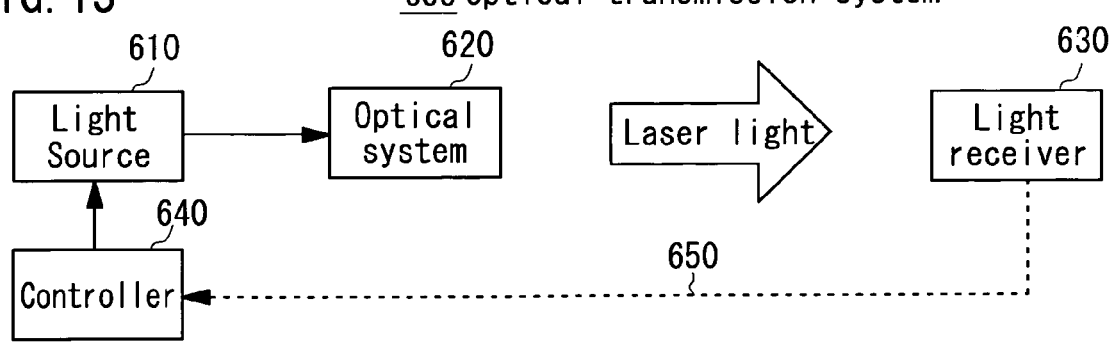
FIG. 13 is a block diagram illustrating a configuration of an optical transmission system.

FIG. 13 illustrates an exemplary configuration of an optical transmission system in which a VCSEL is used as a light source. An optical transmission system 600 includes a light source 610 that contains the VCSEL chip 10, an optical system 620, for example, for concentrating laser light emitted from the light source 610, a light receiver 630 for receiving laser light outputted from the optical system 620, and a controller 640 for controlling the driving of the light source 610. The controller 640 provides a driving pulse signal for driving the VCSEL to the light source 610. The light emitted from the light source 610 is transmitted through the optical system 620 to the light receiver 630 by means of an optical fiber or a reflective mirror for spatial transmission. The light receiver 630 detects laser light with a photodiode, for example. The light receiver 630 is capable of controlling an operation (for example, the start timing of optical transmission) of the controller 640, by a control signal 650.

Figure 14:
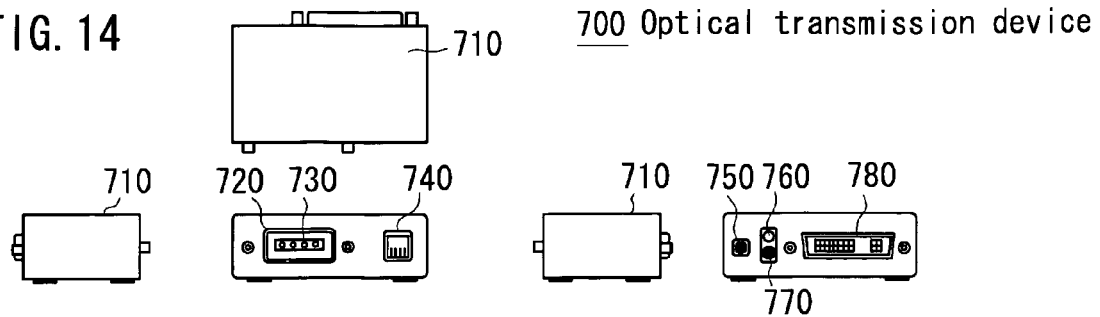
FIG. 14 illustrates an outer configuration of an optical transmission device.

Next, a configuration of an optical transmission device used for an optical transmission system is described. FIG. 14 is an external view of an optical transmission device. An optical transmission device 700 includes a case 710, an optical signal transmitting/receiving connector 720, a light emitting/light receiving element 730, an electrical signal cable connector 740, a power input 750, an LED 760 for indicating normal operation, an LED 770 for indicating an abnormality, a DVI connector 780, and a transmitting circuit board/receiving circuit board 790.

Figure 15:
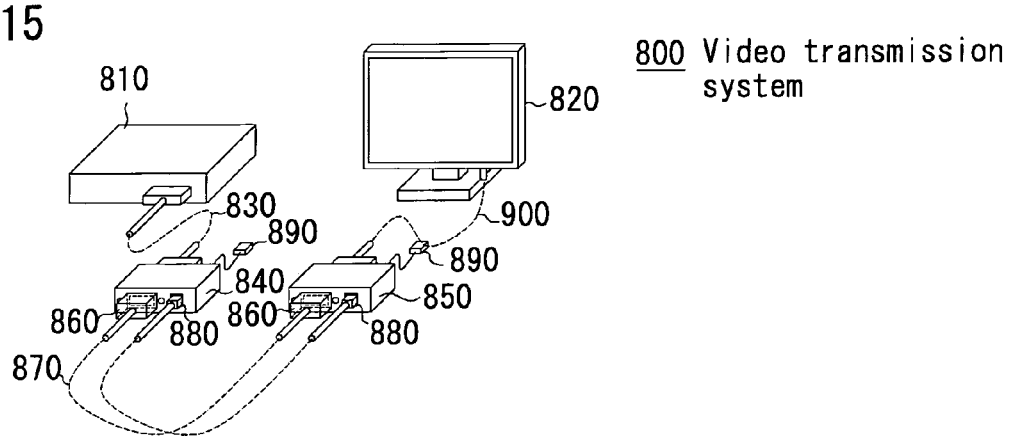
FIG. 15 illustrates a video transmission system in which the optical transmission device of FIG. 14 is used.
Figure 16:
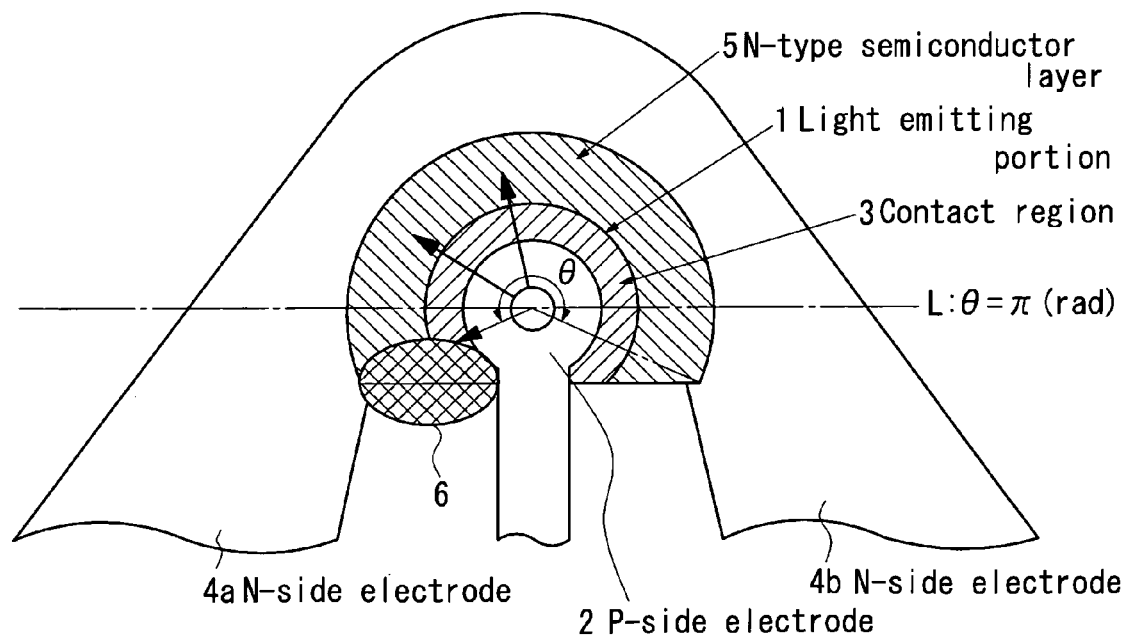
FIG. 16 illustrates problems of a VCSEL of a related art.

FIG. 15 illustrates a video transmission system in which the optical transmission device 700 is used. A video transmission system 800 includes a video signal generator 810, an image display 820, an electrical cable 830 for DVI, a transmitting module 840, a receiving module 850, a connector 860 for video signal transmission optical signal, an optical fiber 870, a cable connector 880 for control signal, a power adapter 890, and an electrical cable 900 for DVI. To transmit a video signal generated at the video signal generator 810 to the image display 820 such as a liquid crystal display, the optical transmission device shown in FIG. 14 is used.

The foregoing description of the examples has been provided for the purposes of illustration and description. It is not intended to be exhaustive or to limit the invention to the precise forms disclosed. Therefore, it should be understood that the present invention may be implemented by other methods within the scope that satisfies requirements of the present invention.

A VCSEL according to an aspect of the present invention has excellent high frequency characteristics and can be used as a light source for optical fiber communication, optical interconnection, or the like.

What is claimed is:

1. A Vertical-Cavity Surface-Emitting Laser (VCSEL) comprising:
   a substrate;
   a first semiconductor layer of a first conductivity-type formed on the substrate;
   an active layer formed on the first semiconductor layer;
   a second semiconductor layer of a second conductivity-type formed on the active layer;
   a first electrode wiring formed on a main surface of the substrate, and electrically connected with the first semiconductor layer;
   a second electrode wiring formed on the main surface of the substrate, and electrically connected with the second semiconductor layer; and
   a light emitting portion formed on the substrate, for emitting laser light,
   a contact portion at which the first electrode wiring is electrically connected to the first semiconductor layer being formed in a range equal to or greater than $\pi/2$ radians and within $\pi$ radians, centering on the light emitting portion.

2. The VCSEL according to claim 1, wherein the contact portion is a region surrounded by a nearly arc line of a near radius r1 that is spaced a first distance apart from the center of the light emitting portion, and a nearly arc line of a far radius r2 that is spaced a second distance apart from the center of the light emitting portion.

3. The VCSEL according to claim 1, wherein the contact portion has a nearly L-shape whose intersecting angle is about $\pi/2$ radians.

4. The VCSEL according to claim 3, wherein the first electrode wiring has a nearly L-shape that corresponds to the nearly L-shape of the contact portion.

5. The VCSEL according to claim 1, wherein the first electrode wiring is connected to a first electrode pad, and the second electrode wiring is connected to a second electrode pad, and the distance between centers of the first electrode pad and the second electrode pad is equal to or less than about 100 micrometers, and the first and second electrode pads do not overlap each other on the main surface of the substrate.

6. The VCSEL according to claim 1, wherein the first electrode wiring is made of a metal multilayer film made of at least equal to or more than four layers.

7. The VCSEL according to claim 1, wherein the first semiconductor layer comprises a first reflective layer wherein AlGaAs layers having different Al-composition are stacked, and the second semiconductor layer comprises a second reflective layer wherein AlGaAs layers having different Al-composition are stacked.

8. The VCSEL according to claim 7, wherein the contact portion comprises an opening formed in the first semiconductor layer, and the first electrode wiring is electrically connected to an AlGaAs layer of the first reflective layer through the opening.

9. The VCSEL according to claim 8, wherein the first semiconductor layer comprises a GaAs buffer layer of a first conductivity having a higher impurity concentration than the AlGaAs layer, and the first electrode wiring is electrically connected to the buffer layer through the opening.

10. The VCSEL according to claim 1, wherein the light emitting portion comprises a cylindrical mesa and an electrode that has an opening in the center thereof being formed at a top portion of the mesa, wherein the electrode is connected to the second electrode wiring.

11. The VCSEL according to claim 9, wherein the mesa comprises at least a second semiconductor layer, and the second semiconductor layer comprises an oxidized region oxidized from side surface of the mesa and a current-confined layer that contains a conductive region surrounded by the oxidized region.

12. A semiconductor laser device comprising:
   a VCSEL device;
   a mount member on which the VCSEL is mounted; and
   a base on which the mount member is mounted,
   the mount member comprising a first and a second transmission lines formed thereon, and each of the first and second transmission lines being electrically connected to first and second electrode pads, respectively,
   the VCSEL device including a substrate, a first semiconductor layer of a first conductivity-type formed on the substrate, an active layer formed on the first semiconductor layer, a second semiconductor layer of a second conductivity-type formed on the active layer, a first electrode wiring formed on a main surface of the substrate, and electrically connected with the first semiconductor layer, a second electrode wiring formed on the main surface of the substrate, and electrically connected with the second semiconductor layer, and a light emitting portion formed on the substrate, for emitting laser light,
   a contact portion at which the first electrode wiring is electrically connected to the first semiconductor layer being formed in a range equal to or greater than $\pi/2$ radians and within $\pi$ radians, centering on the light emitting portion.

13. A module comprising:
   a semiconductor laser device; and
   an optical member,
   the semiconductor laser device including a VCSEL device, a mount member on which the VCSEL is mounted, and a base on which the mount member is mounted,
   the mount member comprising a first and a second transmission lines formed thereon, and each of the first and second transmission lines being electrically connected to first and second electrode pads, respectively, the VCSEL device including a substrate, a first semiconductor layer of a first conductivity-type formed on the substrate, an active layer formed on the first semiconductor layer, a second semiconductor layer of a second conductivity-type formed on the active layer, a first electrode wiring formed on a main surface of the substrate, and electrically connected with the first semiconductor layer, a second electrode wiring formed on the main surface of the substrate, and electrically connected with the second semiconductor layer, and a light emitting portion formed on the substrate, for emitting laser light, a contact portion at which the first electrode wiring is electrically connected to the first semiconductor layer being formed in a range equal to or greater than $\pi/2$ radians and within $\pi$ radians, centering on the light emitting portion.

14. An optical transmission device comprising;

a module; and a transmission unit that transmits laser light emitted from the module via an optical medium, the module including a semiconductor laser device and an optical member, the semiconductor laser device including a VCSEL device, a mount member on which the VCSEL is mounted, and a base on which the mount member is mounted, the mount member comprising a first and a second transmission lines formed thereon, and each of the first and second transmission lines being electrically connected to first and second electrode pads, respectively, the VCSEL device including a substrate, a first semiconductor layer of a first conductivity-type formed on the substrate, an active layer formed on the first semiconductor layer, a second semiconductor layer of a second conductivity-type formed on the active layer, a first electrode wiring formed on a main surface of the substrate, and electrically connected with the first semiconductor layer, a second electrode wiring formed on the main surface of the substrate, and electrically connected with the second semiconductor layer, and a light emitting portion formed on the substrate, for emitting laser light, a contact portion at which the first electrode wiring is electrically connected to the first semiconductor layer being formed in a range equal to or greater than $\pi/2$ radians and within $\pi$ radians, centering on the light emitting portion.

15. An optical transmission system comprising:

a module; and transmission unit that sends laser light emitted from the module, the module including a semiconductor laser device and an optical member, the semiconductor laser device including a VCSEL device, a mount member on which the VCSEL is mounted, and a base on which the mount member is mounted, the mount member comprising a first and a second transmission lines formed thereon, and each of the first and second transmission lines being electrically connected to first and second electrode pads, respectively, the VCSEL device including a substrate, a first semiconductor layer of a first conductivity-type formed on the substrate, an active layer formed on the first semiconductor layer, a second semiconductor layer of a second conductivity-type formed on the active layer, a first electrode wiring formed on a main surface of the substrate, and electrically connected with the first semiconductor layer, a second electrode wiring formed on the main surface of the substrate, and electrically connected with the second semiconductor layer, and a light emitting portion formed on the substrate, for emitting laser light, a contact portion at which the first electrode wiring is electrically connected to the first semiconductor layer being formed in a range equal to or greater than $\pi/2$ radians and within $\pi$ radians, centering on the light emitting portion.

16. An optical spatial transmission system comprising:

a module; and a transmission unit that spatially transmits light emitted from the module, the module including a semiconductor laser device and an optical member, the semiconductor laser device including a VCSEL device, a mount member on which the VCSEL is mounted, and a base on which the mount member is mounted, the mount member comprising a first and a second transmission lines formed thereon, and each of the first and second transmission lines being electrically connected to first and second electrode pads, respectively, the VCSEL device including a substrate, a first semiconductor layer of a first conductivity-type formed on the substrate, an active layer formed on the first semiconductor layer, a second semiconductor layer of a second conductivity-type formed on the active layer, a first electrode wiring formed on a main surface of the substrate, and electrically connected with the first semiconductor layer, a second electrode wiring formed on the main surface of the substrate, and electrically connected with the second semiconductor layer, and a light emitting portion formed on the substrate, for emitting laser light, a contact portion at which the first electrode wiring is electrically connected to the first semiconductor layer being formed in a range equal to or greater than $\pi/2$ radians and within $\pi$ radians, centering on the light emitting portion.

* * * * *